(12) United States Patent
Di et al.

(10) Patent No.: US 11,009,534 B2
(45) Date of Patent: May 18, 2021

(54) WATER LEAKAGE DETECTION BASED ON SMART ELECTRICITY METER

(71) Applicant: International Business Machines Corporation, Armonk, NY (US)

(72) Inventors: Xing Xing Di, Beijing (CN); Kai Guo, Beijing (CN); Peng Tang, Beijing (CN); Chen Tian, Beijing (CN); Jian Wang, Beijing (CN); Chi Xu, Beijing (CN); Yu Yuan, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 431 days.

(21) Appl. No.: 14/863,729

(22) Filed: Sep. 24, 2015

(65) Prior Publication Data

US 2017/0089798 A1 Mar. 30, 2017

(51) Int. Cl.
| | |
|---|---|
| *G01D 4/00* | (2006.01) |
| *G01R 21/00* | (2006.01) |
| *G01M 3/40* | (2006.01) |
| *G01M 3/18* | (2006.01) |

(52) U.S. Cl.
CPC ............ *G01R 21/00* (2013.01); *G01D 4/004* (2013.01); *G01M 3/18* (2013.01); *G01M 3/40* (2013.01); *Y02A 20/00* (2018.01); *Y02B 90/20* (2013.01); *Y04S 20/30* (2013.01)

(58) Field of Classification Search
CPC .......... G01D 4/00; G01D 4/004; G01R 21/00; G01M 3/18; G01M 3/40; Y04S 20/322; Y04S 20/36; Y02B 90/242; Y02A 20/218
See application file for complete search history.

(56) References Cited

U.S. PATENT DOCUMENTS

| | | | | |
|---|---|---|---|---|
| 9,228,853 | B1 * | 1/2016 | Brennan | G01D 4/002 |
| 2004/0104887 | A1 * | 6/2004 | Tsukamoto | G06F 3/016 |
| | | | | 345/156 |
| 2009/0322255 | A1 * | 12/2009 | Lin | H05B 33/0845 |
| | | | | 315/307 |
| 2010/0212748 | A1 | 8/2010 | Davidoff | |
| 2011/0004421 | A1 | 1/2011 | Rosewell et al. | |

(Continued)

FOREIGN PATENT DOCUMENTS

| | | | |
|---|---|---|---|
| CN | 102072407 A | 5/2011 | |
| JP | 2013025472 A * | 2/2013 | |
| WO | WO 2015124972 A1 * | 8/2015 | ............. G01D 4/004 |

OTHER PUBLICATIONS

Cheng et al., "An Alternative Use of Power Quality Information—Load Signature Studies & Applications", 978-1-4673-1943-0/12 ©2012 IEEE, pp. 150-155.

(Continued)

*Primary Examiner* — John E Breene
*Assistant Examiner* — Eyob Hagos
(74) *Attorney, Agent, or Firm* — Gilbert Harmon, Jr.

(57) ABSTRACT

Embodiments of the present invention relate to water leakage detection. Data obtained by a smart electricity meter during a predefined time period is collected, where the smart electricity meter is associated with a water-consuming unit. Usages of certain electric appliances in the water-consuming unit during the predefined time period are determined based on the collected data. The electricity consumption of those appliances is correlated to water consumption. The legitimate water consumption of the water-consuming unit during the predefined time period is then determined based on the usages of the electric appliances.

20 Claims, 2 Drawing Sheets

(56) References Cited

U.S. PATENT DOCUMENTS

| | | | |
|---|---|---|---|
| 2011/0238311 A1* | 9/2011 | Kuhns | G06Q 10/06 702/1 |
| 2013/0231795 A1 | 9/2013 | G et al. | |
| 2013/0231876 A1 | 9/2013 | Hanss et al. | |
| 2014/0207398 A1* | 7/2014 | Lai | G01D 4/00 702/61 |
| 2014/0245208 A1* | 8/2014 | Javey | H04Q 9/00 715/771 |

OTHER PUBLICATIONS

Garcia et al., "The Minimum Night Flow Method Revisited", Water Distribution Systems Analysis Symposium 2006: pp. 1-18, doi: 10.1061/40941(247)35, abstract printed on Aug. 31, 2015, <http://ascelibrary.org/doi/abs/10.1061/40941(247)35>.

Lambert, "Assessing Non-Revenue and its Components—a Practical Approach", ILMSS Ltd, Leakage Italy 2006, IWA Water Loss Task Force Visit Italy, Genova—Ferrara, May 15-19, 2006, pp. 1-10.

Liang et al., "Load Signature Study—Part I: Basic Concept, Structure, and Methodology", IEEE Transactions on Power Delivery, vol. 25, No. 2, Apr. 2010, pp. 551-560.

McKenzie et al., "Water Demand Management Cookbook", Produced and printed in the Republic of South Africa, ISBN 0-620-30734-X, ©UN-Habitat/ Rand Water/ WRP / MIYA, provided by inventor Sep. 5, 2015, pp. 1-236.

"Leakage monitoring Reducing leakage through effective flow measurement", White paper—AG/LEAKAGE-EN, AG/LEAKAGE-EN Sep. 2011, Copyright© 2011 ABB, pp. 1-12.

* cited by examiner

WATER LEAKAGE DETECTION BASED ON SMART ELECTRICITY METER

BACKGROUND

The present invention relates generally to public water system leak detection and more specifically, to detecting water system leaks based on smart electricity meter monitoring.

Every year leakage from water transmission and distribution networks wastes a considerable amount of water. Further, the transmission and distribution networks deliver additional water resources to consumers but the consumers are not billed because of leakage, theft, poor metering or corruption. The waste of water resources leads to significant economic loss. More importantly, statistics show that half of the wasted water would supply an additional 100 million people each year worldwide.

Night flow analysis is an important technology for identifying water leakages. In general, the analysis is performed on the basis of the minimum night flow (MNF) which refers to the water flow that occurs during a given time period in the night (for example, from 12:00 am to 4:00 am) when the consumption in a water system is assumed to be lowest. Net night flow (NNF) of the water system, which discovers the water leakages, can be determined by subtracting legitimate night flow (LNF) from MNF. LNF refers to the water flow consumed by the consumers. For a target area such as a community, MNF can be directly read, e.g., from a main water meter of the target area. Therefore, the critical point in the night flow analysis is to determine LNF in an accurate and cost-effective way.

SUMMARY

In general, example embodiments of the present invention provide a method, a device, and a computer program product for water leakage detection.

In an aspect, a method is provided. According to the method, data obtained by a smart electricity meter during a predefined time period is collected from a water-consuming unit. Then the usage of a first electric appliance in the water-consuming unit during the predefined time period is determined based on the collected data. The legitimate water consumption of the water-consuming unit during the predefined time period is determined based on the usage of the first electric appliance.

In another aspect, a device is provided. The device includes a processing unit and a memory coupled to the processing unit and storing instructions thereon. The instructions perform acts when executed by the processing unit. The acts include collecting data obtained by a smart electricity meter during a predefined time period, where the smart electricity meter is associated with a water-consuming unit. The acts further include determining, based on the collected data, a usage of a first electric appliance in the water-consuming unit during the predefined time period. In addition, the acts include determining legitimate water consumption of the water-consuming unit during the predefined time period based on the usage of the first electric appliance.

In yet another aspect, a computer program product is provided. The computer program product is tangibly stored on a non-transient machine-readable medium and comprises machine-executable instructions. The instructions, when executed on a device, causing the device to collect data obtained by a smart electricity meter during a predefined time period, the smart electricity meter being associated with a water-consuming unit; determine, based on the collected data, a usage of a first electric appliance in the water-consuming unit during the predefined time period; and determine legitimate water consumption of the water-consuming unit during the predefined time period based on the usage of the first electric appliance.

It is to be understood that the Summary is not intended to identify key or essential features of embodiments of the present invention, nor is it intended to be used to limit the scope of the present invention. Other features of the present invention will become easily comprehensible through the description below.

DETAILED DESCRIPTION

The principle of the present invention will now be described with reference to some example embodiments. It is to be understood that these embodiments are described only for the purpose of illustration and to assist those skilled in the art to understand and implement the present invention, without suggesting any limitations as to the scope of the invention. It should be noted that the invention described herein can be implemented in various manners other than the ones describe below.

As used herein, the term "includes" and its variants are to be read as open terms that mean "includes, but is not limited to." The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Figure 1:
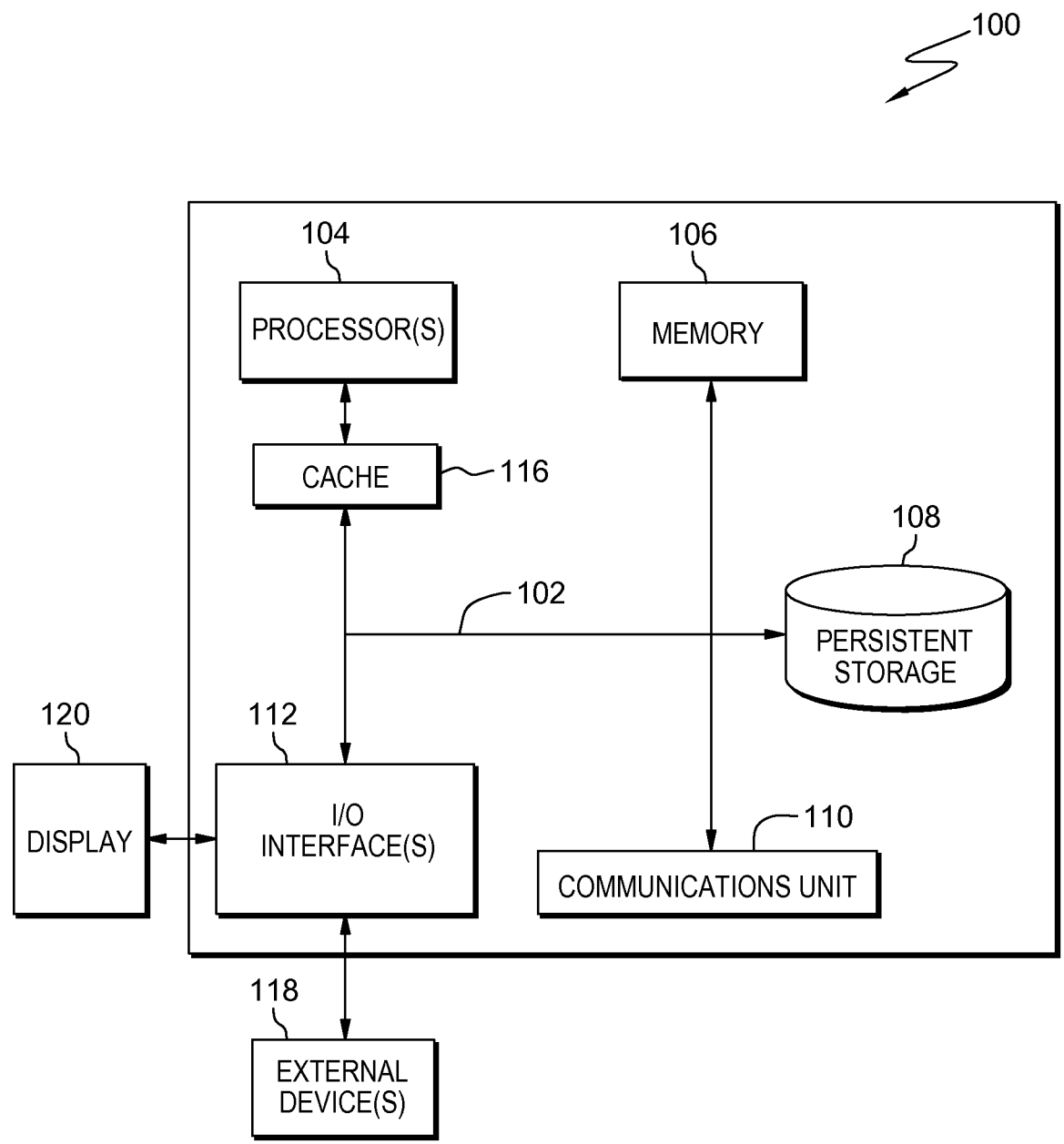
FIG. 1 is a block diagram of an electronic device suitable for implementing embodiments of the present invention.

FIG. 1 depicts computer system 100, an example computer system representative of server a computer. Computer system 100 includes communications fabric 102, which provides communications between computer processor(s) 104, memory 106, persistent storage 108, communications unit 110, and input/output (I/O) interface(s) 112. Communications fabric 102 can be implemented with any architecture designed for passing data and/or control information between processors (such as microprocessors, communications and network processors, etc.), system memory, peripheral devices, and any other hardware components within a system. For example, communications fabric 102 can be implemented with one or more buses.

Computer system 100 includes processors 104, cache 116, memory 106, persistent storage 108, communications unit 110, input/output (I/O) interface(s) 112 and communications fabric 102. Communications fabric 102 provides communications between cache 116, memory 106, persistent storage 108, communications unit 110, and input/output (I/O) interface(s) 112. Communications fabric 102 can be implemented with any architecture designed for passing data and/or control information between processors (such as microprocessors, communications and network processors, etc.), system memory, peripheral devices, and any other hardware components within a system. For example, communications fabric 102 can be implemented with one or more buses or a crossbar switch.

Memory 106 and persistent storage 108 are computer readable storage media. In this embodiment, memory 106 includes random access memory (RAM). In general, memory 106 can include any suitable volatile or non-volatile computer readable storage media. Cache 116 is a fast memory that enhances the performance of processors 104 by holding recently accessed data, and data near recently accessed data, from memory 106.

Program instructions and data used to practice embodiments of the present invention may be stored in persistent storage 108 and in memory 106 for execution by one or more of the respective processors 104 via cache 116. In an embodiment, persistent storage 108 includes a magnetic hard disk drive. Alternatively, or in addition to a magnetic hard disk drive, persistent storage 108 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 108 may also be removable. For example, a removable hard drive may be used for persistent storage 108. Other examples include optical and magnetic disks, thumb drives, and smart cards that are inserted into a drive for transfer onto another computer readable storage medium that is also part of persistent storage 108.

Communications unit 110, in these examples, provides for communications with other data processing systems or devices. In these examples, communications unit 110 includes one or more network interface cards. Communications unit 110 may provide communications through the use of either or both physical and wireless communications links. Program instructions and data used to practice embodiments of the present invention may be downloaded to persistent storage 108 through communications unit 110.

I/O interface(s) 112 allows for input and output of data with other devices that may be connected to each computer system. For example, I/O interface 112 may provide a connection to external devices 118 such as a keyboard, keypad, a touch screen, and/or some other suitable input device. External devices 118 can also include portable computer readable storage media such as, for example, thumb drives, portable optical or magnetic disks, and memory cards. Software and data used to practice embodiments of the present invention can be stored on such portable computer readable storage media and can be loaded onto persistent storage 108 via I/O interface(s) 112. I/O interface(s) 112 also connect to display 120.

Display 120 provides a mechanism to display data to a user and may be, for example, a computer monitor.

Example embodiments of the present invention will be described in the following paragraphs. As discussed above, it is important in water leakage detection to determine the actual water consumption in a target area, e.g., a community, during a given time period. For example, in night flow analysis, the critical point is to determine LNF. Conventionally, the water consumption is estimated based on user surveys. For example, a number of households from a target community are selected as samples. By determining the water consumption of these sample households via questionnaires, the total water consumption of the target community during the time period can be proportionally estimated. This approach leads to significant human resource cost. Moreover, the accuracy is not very high. Other approaches rely on smart water meters which are capable of recording the real-time or near real-time water consumption. However, the high cost prohibits the widespread use of the smart water meters.

Compared with the smart water meters, smart electricity meters have been widely used. The smart electricity meters usually include real-time or near real-time sensors which not only measure total electricity consumption but also provide a way of measuring other useful information, for example, indicating when the energy is consumed at each metered site, the type of electric appliances that consume the energy, and the like. In accordance with embodiments of the invention, without reliance on the expensive smart water meters, embodiments use the smart electricity meters to estimate the actual water consumption during the specified time period.

More particularly, the inventors have found that within a certain time period (e.g., from 2:00 am to 4:00 am), water consumption has a strong correlation with electricity consumption. That is, when the water is consumed during such a time period, some certain electric appliances will usually be used. In accordance with embodiments of the present invention, the correlations between the water consumption and electricity consumption are utilized. Data obtained by the smart electricity meters in the target area is collected and analyzed to determine the usages of certain types of electric appliances during a given time period. Then the actual water consumption in the target area during the time period can be precisely determined based on the usages of those electric appliances.

Figure 2:
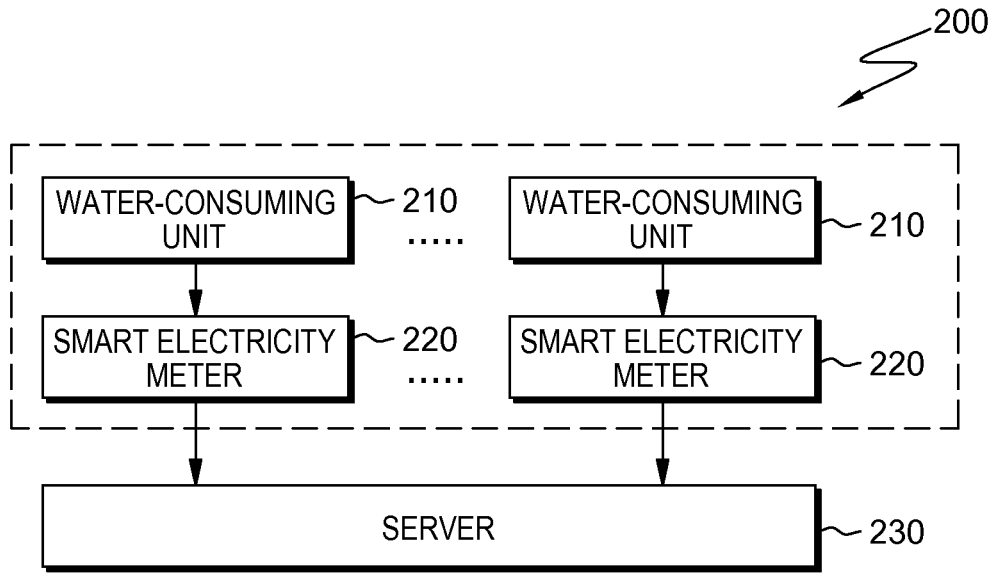
FIG. 2 is a block diagram of an environment in which embodiments of the present invention can be implemented.

FIG. 2 depicts an environment in which example embodiments of the present invention can be implemented. As shown, the target area 200 includes a plurality of water-consuming units 210. Each water-consuming unit 210 includes one or more water-consuming facilities that consume water resource. For example, in those embodiments where the target area 200 is a residential community or a part thereof, the water-consuming units 210 may be households in the community, and the water-consuming facilities may include flush toilets, bathtubs, and the like. As another example, the target area may be an industrial park and the water-consuming units 210 may be factories in the industrial park. It is to be understood that the target area 200 may include other water-consuming units than those shown in FIG. 2.

The water-consuming units 210 may each include electric appliances (not shown) which will consume electric energy when being used. Smart electricity meters 220 are operable to obtain data concerning various aspects of the electricity consumption of the electric appliances in the water-consuming units 210. As described above, in addition to the total consumption of energy, the smart electricity meters 220 are capable of capturing other useful information about the electricity consumption. In the example shown in FIG. 2, each water-consuming unit 210 is equipped with a smart electricity meter 220. This is merely for the purpose of illustration without suggesting any limitation as to the scope of the present invention. In alternative embodiments, a smart electricity meter 220 may be used to obtain electricity consumption data of multiple water-consuming units 210. It is also possible that a water-consuming unit 210 is equipped with multiple smart electricity meters 220.

The data obtained by the smart electricity meters 220 can be transmitted to the server 230 through any suitable wired and/or wireless communication medium. The server 230 is a machine with data processing capability, which can be implemented by the computer system 100 as shown in FIG.

1, for example. The server 230 processes the collected data to determine the water consumption in the target area 200 during a given time period. The functionality of the server 230 will be described with reference to FIG. 3.

Figure 3:
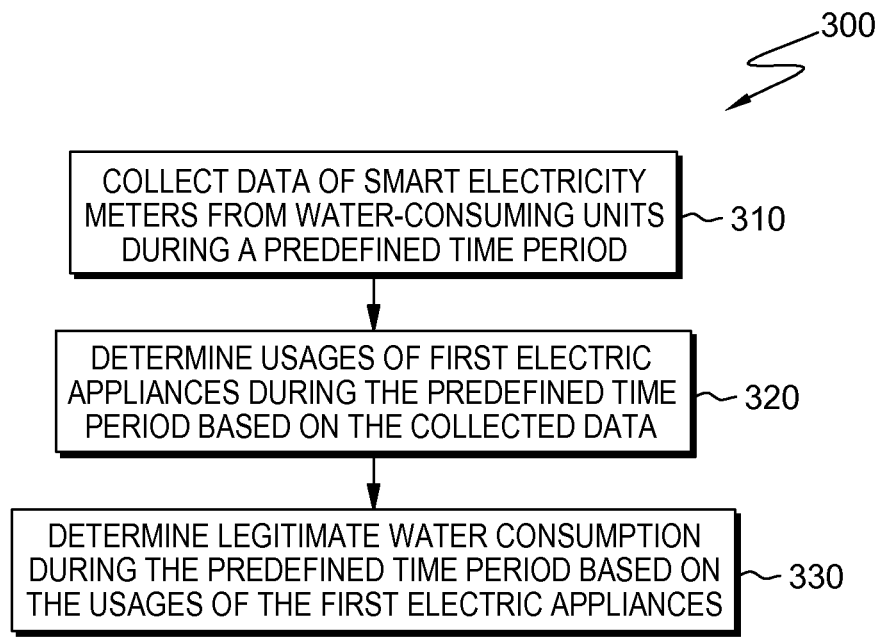
FIG. 3 is a flowchart of a method for water consumption detection in accordance with embodiments of the present invention.

FIG. 3 depicts a flowchart of a method 300 for detecting water consumption in a target area in accordance with embodiments of the present invention. In step 310, the server 230 collects data obtained by the smart electricity meters 220 from the one or more water-consuming units 210 in the target area 200. The data includes information about the electricity consumption of each water-consuming unit 210 in the target area 200 during a predefined time period. For the sake of discussion, the predefined time period is referred to as "target time period." In accordance with embodiments of the present invention, the target time period is selected in such a way that the water consumption has relatively strong correlation to the electricity consumption in the water-consuming units 210.

For example, in some embodiments, the target time period may be at night from 2:00 am to 4:00 am. Within this time period, the water consumption in the residential community is considered to be lowest. Moreover, it is found that the majority of water consumption in this time period is caused by the usages of flush toilets, which are in turn correlated to the usages of lights in households. That is, the water consumption and electricity consumption in this period are strongly correlated to each other. Of course, it is to be understood that the selection of target time period is not limited to this example. Any other suitable time period may be selected as long as the water consumption and electricity consumption in the target area 200 are correlated to each other within the selected time period.

The method 300 then proceeds to step 320, where the usages of a certain type of electric appliances in the water-consuming units 210 during the target time period are determined based on the data collected in step 310. For the sake of discussion, an electric appliance of that type is referred to as a "first electric appliance(s)." As described above, within the target time period, the water consumption and electricity consumption in the target area 200 are correlated. The first electric appliances are those appliances that cause electricity consumption correlated to the water consumption during the target time period. For instance, in the above example where the target period is at night, a light in a household is a first electric appliance. By detecting the usages of the first electric appliances, the electricity consumption correlated to water consumption in the target area 200 can be determined.

In some embodiments, the turn-on count of each first electric appliance during the target time period may be determined in step 320, because the water consumption may be related to the turn-on count of the first electric appliance. By way of example, at night, a person will usually turn on a light when he/she enters the washroom and will turn off the light when he/she leaves. That is, every time when the light is turned on during the night, it might indicate that the toilet is used. Therefore, the turn-on count of the light may represent the number of times that the toilet is used during the night.

For a first electric appliance, its turn-on count during the target time period may be determined by analyzing the data which is obtained by the associated smart electricity meter 220 and which is collected by the server 230 in step 310. In some embodiments, the pattern of the data is analyzed to identify the turn-on of the first electric appliance. More particularly, when an electric appliance such as a light is turned on, there will be a rising edge in the waveform of the corresponding data captured by the smart electricity meter 220. By detecting the rising edges in the waveform by any appropriate technology, the turn-on count of the first electric appliance can be determined In addition to or instead of the turn-on count, in step 320, the server 230 may determine the turn-on duration in which each first electric appliance is turned on. To this end, in one embodiment, the turn-on time and turn-off time of the first electric appliance may be identified by analyzing the data as collected in step 310. As known, the turn-on and turn-off of an electric appliance can be identified by detecting the rising edges and falling edges in the waveform of the corresponding data, respectively. The time duration defined by a pair of turn-on time and turn-off time can be determined as the turn-on duration. Effects of the turn-on duration of the first electric appliance in determining the water consumption will be discussed in the following paragraphs.

In some embodiments, in step 320, the data collected in step 310 is directly used. Alternatively, in other embodiments, the data may be filtered to remove noises and thus improve accuracy of the detection of usages of the first electric appliances. For example, in one embodiment, the server 230 may filter the data by removing one or more parts that represent the usages of other electric appliances (referred to as "second electric appliances") than the first electric appliances during the target time period. Different from the first electric appliances, the second electric appliances in the water-consuming units 210 are continuously used throughout the target time period. Examples of the second electric appliances include, but are not limited to, refrigerators, air conditioners, and the like. The usages of the second electric appliances can be excluded from the subsequent processing since the electricity consumption of those appliances is not correlated to the water consumption.

Detection of the usages of the second electric appliances is as well based on the collected data. For example, it is known that the continuous usage of an electric appliance will result in a substantially flat portion in the waveform of the corresponding data. Therefore, it is possible to detect those substantially flat portions in the waveform to identify the usages of the second electric appliances. By excluding the data related to the second electric appliances, the usages of the first electric appliances can be detected in step 320 more accurately.

Next, in step 330, the legitimate water consumption of the water-consuming units 210 during the target time period is determined based on the usages of the first electric appliances as determined in step 320. In some embodiments, the turn-on counts of the first electric appliances in the water-consuming units 210 during the target time period are determined in step 320, as described above. In such embodiments, in step 330, the water consumption within the target time period can be determined based on the turn-on counts of the first electric appliances and the unit water consumption of the water-consuming facilities associated with the first electric appliances. As used herein, the unit water consumption of a water-consuming facility refers to the water volume consumed in each usage of that water-consuming facility.

As described above, when a first electric appliance is turned on, an associated water-consuming facility in the respective water-consuming unit 210 can be used. For instance, if the target time period is at night, the first electric appliances can be lights and the associated water-consuming facilities can be flush toilets. When a person turns on a light at night, it can be supposed that the person is going to use the flush toilet. Accordingly, the water consumption in a water-consuming unit 200 can be determined by multiplying the unit water consumption of the flush toilet with the turn-on count of the light(s).

In some embodiments, the unit water consumption of a water-consuming facility is determined in advance. For example, the water volume consumed in each use of a flush toilet can be set to a constant value. Alternatively, the unit water consumption of a water-consuming facility can be determined based on the turn-on duration of the associated first electric appliance as determined in step 320.

For example, in some embodiments, the turn-on duration of a first electric appliance can be used to determine what kind the water-consuming facility is being used. It would be appreciated that a first electric appliance can be associated with various kinds of water-consuming facilities. For example, the usage of a light during the night can be related to the usage of a flush toilet or a bathtub. In some embodiments, if the turn-on duration of the light is within a predefined range (for example, from 2 minutes to 15 minutes), the server 230 deduces that the user is using a flush toilet. Accordingly, the unit water consumption of the toilet can be used in step 330. Otherwise, if the turn-on duration of the light is within another predefined range (for example, from 15 minutes to 30 minutes), the server 230 determines that the user could be using a bathtub rather than the toilet and uses the unit water consumption of the bathtub. Specifically, in some embodiments, if the turn-on duration of a first electric appliance is too long or too short, the corresponding data can be excluded from the subsequent processing.

Alternatively, or in addition, the turn-on duration of a first electric appliance can be used to identify an operating mode of the associated water-consuming facility. Still considering the usage of toilets during the night, it is known that a toilet can have different operating modes corresponding to different unit water consumption. In one embodiment, the turn-on duration of the light can be used to select one of the operating modes. Only for the purpose of illustration, it is supposed that a flush toilet have two operating modes. If the turn-on duration of the light is below a predefined threshold, the operating mode with less unit water consumption can be selected. Otherwise, the other operating mode with larger unit water consumption can be selected. As such, in step 330, the unit water consumption corresponding to the selected mode can be used.

In addition, it is to be understood that a first electric appliance is not necessarily associated with only one water-consuming facility. Instead, the usage of a first electric appliance can suggest the usages of multiple different water-consuming facilities. For example, turn-on of a light at night can be associated with the usages of a toilet and a hand washing sink. In such embodiments, the unit water consumption of multiple water-consuming facilities can be summed and then multiplied with the turn-on count of the associated first electric appliance.

By applying the method 300 to the data collected by each of the smart electricity meters 220, the total water consumption in the target area 200 can be determined Given the total water consumption, the water leakages in the target area 200 can be estimated. To this end, total water supply to the water-consuming units 210 in the target area 200 is determined The total water supply can be determined directly from a main water meter for the target 200. By subtracting the water consumption from the total water supply, the water leakages in the target area 200 is determined in an accurate and cost-effective way. Specifically, in those embodiments where the target time period is at night, the night flow analysis can be achieved where the water consumption determined in step 330 acts as LNF.

In another aspect of the embodiments described herein, it should be noted that the analysis described above for the determination of the volume of water loss, i.e. NNF=MNF−LNF can be based on real-time data collected directly from the smart electricity meters 220.

The components described herein are identified based upon the application for which they are implemented in a specific embodiment of the invention. However, it should be appreciated that any particular component nomenclature herein is used merely for convenience, and thus the invention should not be limited to use solely in any specific application identified and/or implied by such nomenclature.

The present invention may be a system, a method and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems) and computer program products according to embodiments of the invention. It is understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method for detecting water distribution network leakage, the computer-implemented method comprising:
    collecting data obtained by a smart electricity meter during a predefined time period, the smart electricity meter being associated with a water-consuming unit;
    determining, based on the data, a usage count of a first electric appliance in the water-consuming unit during the predefined time period based on a turn-on count of the first electric appliance and a turn-on duration of time from the time the first electric appliance is turned on to the time the first electric appliance is turned off, wherein the turn-on duration is from 2 minutes to 15 minutes; and
    determining legitimate water consumption of the water-consuming unit during the predefined time period based on both the usage count of the first electric appliance and a predetermined toilet flush volume, wherein the predetermined toilet flush volume is multiplied by the usage count; and
    calculating the water distribution network leakage over a target area based on subtracting the legitimate water consumption from metered water usage of water consuming units in the target area.

2. The computer-implemented method of claim 1, wherein determining the legitimate water consumption further comprises:
    determining water consumption of a water-consuming facility in the water-consuming unit, a usage of the water-consuming facility being correlated to the usage of the first electric appliance; and
    determining the legitimate water consumption based on the turn-on count and the duration of time of the first electric appliance and the water consumption of the water-consuming facility.

3. The computer-implemented method of claim 2, wherein determining the usage of the first electric appliance further comprises determining the turn-on duration of the first electric appliance during the predefined time period and excluding an on event associated with the water-consuming facility if the on event duration exceeds a predefined value, and
    wherein determining water consumption of the water-consuming facility further comprises at least one of the following:
        determining a type of the water-consuming facility based on the turn-on duration; and determining the water consumption by identifying an operating mode of the water-consuming facility based on the turn-on duration.

4. The computer-implemented method of claim 1, wherein determining the usage of the first electric appliance further comprises:
determining the usage of the first electric appliance by analyzing a pattern of the collected data.

5. The computer-implemented method of claim 1, wherein determining the usage of the first electric appliance further comprises:
filtering the data to create filtered data based on removing a part of the data that represents a usage of a second electric appliance in the water-consuming unit, the second electric appliance being continuously used during the predefined time period; and
determining the usage of the first electric appliance based on the filtered data.

6. The computer-implemented method of claim 1, further comprising:
determining the legitimate water consumption of a plurality of water-consuming units during the predefined time period;
determining water supply to the plurality of water-consuming units during the predefined time period; and
determining water leakages related to the plurality of water-consuming units based on the legitimate water consumption and the water supply.

7. The computer-implemented method of claim 1, wherein the predefined time period is at night, and wherein the first electric appliance is a light.

8. A device for detecting water distribution network leakage, the device comprising:
a processing unit;
a memory coupled to the processing unit and storing instructions thereon, the instructions, when executed by the processing unit, performing acts comprising:
collecting data obtained by a smart electricity meter during a predefined time period, the smart electricity meter being associated with a water-consuming unit;
determining, based on the data, a usage count of a first electric appliance in the water-consuming unit during the predefined time period based on a turn-on count of the first electric appliance and a turn-on duration of time from the time the first electric appliance is turned on to the time the first electric appliance is turned off, wherein the turn-on duration is from 2 minutes to 15 minutes; and
determining legitimate water consumption of the water-consuming unit during the predefined time period based on both the usage count of the first electric appliance and a predetermined toilet flush volume, wherein the predetermined toilet flush volume is multiplied by the usage count; and
calculating the water distribution network leakage over a target area based on subtracting the legitimate water consumption from metered water usage of water consuming units in the target area.

9. The device of claim 8, wherein determining the legitimate water consumption further comprises:
determining water consumption of a water-consuming facility in the water-consuming unit, a usage of the water-consuming facility being correlated to the usage of the first electric appliance; and determining the legitimate water consumption based on the turn-on count and the duration of time of the first electric appliance and the water consumption of the water-consuming facility.

10. The device of claim 9, wherein determining the usage of the first electric appliance further comprises determining a turn-on duration of the first electric appliance during the predefined time period and excluding an on event associated with the water-consuming facility if the on event duration exceeds a predefined value, and
wherein determining water consumption of the water-consuming facility further comprises at least one of the following:
determining a type of the water-consuming facility based on the turn-on duration; and
determining the water consumption by identifying an operating mode of the water-consuming facility based on the turn-on duration.

11. The device of claim 8, wherein determining the usage of the first electric appliance further comprises:
determining the usage of the first electric appliance by analyzing a pattern of the collected data.

12. The device of claim 8, wherein determining the usage of the first electric appliance further comprises:
filtering the data to create filtered data based on removing a part of the data that represents a usage of a second electric appliance in the water-consuming unit, the second electric appliance being continuously used during the predefined time period; and
determining the usage of the first electric appliance based on the filtered data.

13. The device of claim 8, the acts further comprising:
determining the legitimate water consumption of a plurality of water-consuming units during the predefined time period;
determining water supply to the plurality of water-consuming units during the predefined time period; and
determining water leakages related to the plurality of water-consuming units based on the legitimate water consumption and the water supply.

14. The device of claim 8, wherein the predefined time period is at night, and wherein the first electric appliance is a light.

15. A computer program product for detecting water distribution network leakage, the computer program product comprising:
one or more non-transitory computer readable storage media and program instructions stored on the one or more non-transitory computer readable storage media, the program instructions comprising:
program instructions to collect data obtained by a smart electricity meter during a predefined time period, the smart electricity meter being associated with a water-consuming unit;
program instructions determine, based on the data, a usage count of a first electric appliance in the water-consuming unit during the predefined time period based on a turn-on count of the first electric appliance and a turn-on duration of time from the time the first electric appliance is turned on to the time the first electric appliance is turned off, wherein the turn-on duration is from 2 minutes to 15 minutes; and
program instructions determine legitimate water consumption of the water-consuming unit during the predefined time period based on both the usage count of the first electric appliance and a predetermined toilet flush volume, wherein the predetermined toilet flush volume is multiplied by the usage count; and program instructions to calculate the water distribution network leakage over a target area based on subtracting the legitimate water consumption from metered water usage of water consuming units in the target area.

16. The computer program product of claim 15, wherein the instructions, when executed on the device, further cause the device to:

determine water consumption of a water-consuming facility in the water-consuming unit, a usage of the water-consuming facility being correlated to the usage of the first electric appliance; and determine the legitimate water consumption based on the turn-on count and the duration of time of the first electric appliance and the water consumption of the water-consuming facility.

17. The computer program product of claim 16, wherein the instructions, when executed on the device, further cause the device to:

determine turn-on duration of the first electric appliance during the predefined time period and excluding an on event associated with the water-consuming facility if the on event duration exceeds a predefined value; and determine the water consumption of the water-consuming facility by at least one of the following:

determining a type of the water-consuming facility based on the turn-on duration; and determining the water consumption by identifying an operating mode of the water-consuming facility based on the turn-on duration.

18. The computer program product of claim 15, wherein the instructions, when executed on the device, further cause the device to:

determine the usage of the first electric appliance by analyzing a pattern of the collected data.

19. The computer program product of claim 15, wherein the instructions, when executed on the device, further cause the device to:

filter the data to create filtered data based on removing a part of the data that represents a usage of a second electric appliance in the water-consuming unit, the second electric appliance being continuously used during the predefined time period; and determine the usage of the first electric appliance based on the filtered data.

20. The computer program product of claim 15, wherein the instructions, when executed on the device, further cause the device to:

determine the legitimate water consumption of a plurality of water-consuming units during the predefined time period;

determine water supply to the plurality of water-consuming units during the predefined time period; and determine water leakages related to the plurality of water-consuming units based on the legitimate water consumption and the water supply.

* * * * *